(12) United States Patent
Baumgartner et al.

(10) Patent No.: US 7,350,169 B2
(45) Date of Patent: Mar. 25, 2008

(54) METHOD AND SYSTEM FOR ENHANCED VERIFICATION THROUGH STRUCTURAL TARGET DECOMPOSITION

(75) Inventors: Jason Raymond Baumgartner, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 11/143,330

(22) Filed: Jun. 2, 2005

(65) Prior Publication Data

US 2006/0277507 A1 Dec. 7, 2006

(51) Int. Cl.
*G06F 17/50* (2006.01)

(52) U.S. Cl. ............................................. 716/5; 716/18

(58) Field of Classification Search .................... 716/2, 716/4–6, 18
See application file for complete search history.

(56) References Cited

U.S. PATENT DOCUMENTS

2006/0129959 A1* 6/2006 Mang et al. .................... 716/5

OTHER PUBLICATIONS

Bertacco et al., The Disjunctive Decomposition of Logic Functions, International Conference on Computer-Aided Design, 1997, pp. 78-82.

Sistla et al., Symmetry and Reduced Symmetry in Model Checking, International Conference on Computer Aided Verification, 2001, pp. 91-103.

* cited by examiner

*Primary Examiner*—Paul Dinh
(74) *Attorney, Agent, or Firm*—Casimer K. Salys; Dillon & Yudell LLP

(57) ABSTRACT

A method, system and computer program product for performing verification of an electronic design is disclosed. The method includes receiving a design, wherein the design includes a first target set and a first register set including one or more registers. A structural product extraction is formed from one or more targets from the first target set and the structural product extraction is recursed for one or more next-state functions of a subset of the one or more registers. A sum-of-products form is recursed from the structural product extraction for one or more next-state functions of a subset of the one or more registers and a product-of-sums form of a result of the second recursing is decomposed to generate a decomposition of the product-of-sums form. The decomposition of the product-of-sums form is synthesized into a second target set and a subset of the second target set to recursively decompose is chosen. In response to the subset of the second target set being nonempty, the first target set is recursively decomposed and, in response to the second target set being empty, verification is applied to the second target set.

7 Claims, 5 Drawing Sheets

METHOD AND SYSTEM FOR ENHANCED VERIFICATION THROUGH STRUCTURAL TARGET DECOMPOSITION

CROSS-REFERENCE TO RELATED APPLICATIONS

The present application is related to the following co-pending U.S. patent applications filed on even date herewith, and incorporated herein by reference in their entirety:

Ser. No. 11,143,331(AUS 920050371US 1), entitled "METHOD AND SYSTEM FOR ENHANCED VERIFICATION THROUGH BINARY DECISION DIAGRAM-BASED TARGET DECOMPOSITION".

BACKGROUND OF THE INVENTION

1. Technical Field

The present invention relates in general to verifying designs and in particular to decomposing logic. Still more particularly, the present invention relates to a system, method and computer program product for performing structural target decomposition.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification for demonstrating the correctness of a design. The task of hardware verification has become one of the most important and time-consuming aspects of the design process.

Among the available verification techniques, formal and semiformal verification techniques are powerful tools for the construction of correct logic designs. Formal and semiformal verification techniques offer the opportunity to expose some of the probabilistically uncommon scenarios that may result in a functional design failure, and frequently offer the opportunity to prove that the design is correct (i.e., that no failing scenario exists).

Unfortunately, the resources needed for formal verification, or any verification, of designs are proportional to design size. Formal verification techniques require computational resources which are exponential with respect to the design under test. Similarly, simulation scales polynomially and emulators are gated in their capacity by design size and maximum logic depth. Semi-formal verification techniques leverage formal methods on larger designs by applying them only in a resource-bounded manner, though at the expense of incomplete verification coverage. Generally, coverage decreases as design size increases.

One commonly-used approach to formal and semiformal analysis for applications operating on representations of circuit structures is to represent the underlying logical problem structurally (as a circuit graph), and then use Binary Decision Diagrams (BDDs) to convert the structural representation into a functionally canonical form. In such an approach, in which a logical problem is represented structurally and binary decision diagrams are used to convert the structural representation into a functionally canonical form, a set of nodes for which binary decision diagrams are required to be built, called "sink" nodes, is identified. Examples of sink nodes include the output node or nodes in an equivalence checking or a false-paths analysis context. Examples of sink nodes also include targets in a property-checking or model-checking context.

Techniques for reducing the complexity of a design have concentrated on reducing the size of a design representation. Logic synthesis optimization techniques are employed to attempt to render smaller designs to enhance chip fabrication processes. Numerous techniques have been proposed for reducing the size of a structural design representation. For example, redundancy removal techniques attempt to identify gates in the design which have the same function, and merge one onto the other. Such techniques tend to rely upon binary decision diagram-based or Boolean satisfiability-based analysis to prove redundancy, which tend to be computationally expensive. Further, the prior art performs poorly with respect to synthesis of binary decision diagrams with inverted edges and quantifiable as well as nonquantifiable variables.

What is needed is a method for reducing verification complexity by decomposing targets into simpler sub-targets, which may be independently verified.

SUMMARY OF THE INVENTION

A method, system and computer program product for performing verification of an electronic design is disclosed. The method includes receiving a design, wherein the design includes a first target set and a first register set including one or more registers. A structural product extraction is formed from one or more targets from the first target set and the structural product extraction is recursed for one or more next-state functions of a subset of the one or more registers. A sum-of-products form is recursed from the structural product extraction for one or more next-state functions of a subset of the one or more registers and a product-of-sums form of a result of the second recursing is decomposed to generate a decomposition of the product-of-sums form. The decomposition of the product-of-sums form is synthesized into a second target set and a subset of the second target set to recursively decompose is chosen. In response to the subset of the second target set being nonempty, the first target set is recursively decomposed and, in response to the second target set being empty, verification is applied to the second target set.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

The present invention provides a method, system, and computer program product for enhanced verification through structural target decomposition. As will be explained below, a preferred embodiment of the present invention provides a novel method for reducing verification complexity via decomposing targets into simpler sub-targets which may be independently verified. The approach of the present invention is useful both for completing proofs, as well as for finding counterexamples. The approach of the present invention is also particularly useful in combination with other transformation algorithms, possibly as a component of a transformation-based verification system.

Figure 1:
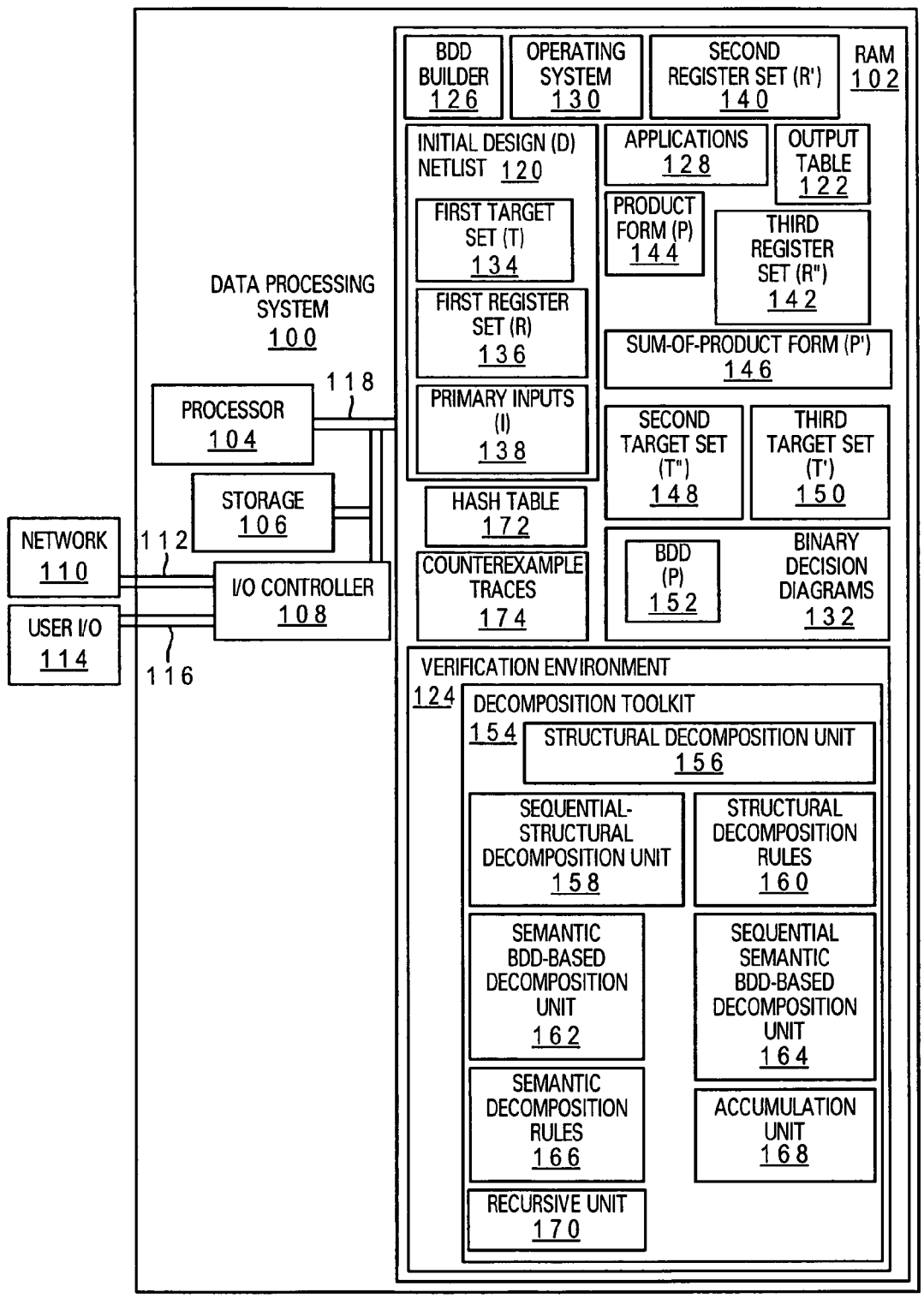
FIG. 1 depicts a block diagram of a general-purpose data processing system for performing the present invention of a method, system and computer program product for enhanced verification through structural target decomposition.

With reference now to the figures, and in particular with reference to FIG. 1, a block diagram of a general-purpose data processing system for performing the present invention of a method, system and computer program product enhanced verification through structural target decomposition, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include an initial design (D) netlist 120, a binary decision diagram builder 126 for building binary decision diagrams 132 and an output table 122 for interaction with a verification environment 124. In the embodiment shown in FIG. 1, initial design (D) netlist 120 contains first target set (T) 134 first register set (R) 136 and primary inputs (I) 138. Other applications 128 and verification environment 124 interface with processor 104, RAM 102, I/O control 108, and storage 106 through operating system 130. One skilled in the data processing arts will quickly realize that additional components of data processing system 100 may be added to or substituted for those shown without departing from the scope of the present invention. Other data structures in RAM 102 include second register set (R') 140, third register set (R") 142, product form (P) 144, sum-of-products form (P') 146, second target set (T') 148, third target set (T") 150, hash table 172, counterexample traces 174 and BDD (P) 152 within Binary Decision Diagrams 132.

A netlist, such as design (D) netlist 120, is a popular means of compactly representing problems derived from circuit structures in the computer-aided design of digital circuits. Such a representation is non-canonical and offers the ability to analyze the function from the nodes in the graph. Initial design (D) netlist 120, contains a directed graph with vertices representing gates and edges representing interconnections between those gates. The gates have associated functions, such as constants, primary inputs (I) 138 (e.g. RANDOM gates, which deliver random values at the given input), combinational logic (e.g., AND gates), and sequential elements (hereafter referred to as first register set 136). Registers from first register set 136 have two associated components; their next-state functions and their initial-value functions, which are represented as other gates in the graph. Semantically, for a given register from first register set 136, the value appearing at its initial-value gate at time "0" ("initialization" or "reset" time) will be applied by verification environment 124 as the value of the register itself; the value appearing at its next-state function gate at time "i" will be applied to the register itself at time "i+1".

Certain gates in design (D) netlist 120 are be labeled as targets in first target set (T) 134. Targets in first target set (T) 134 correlate to the properties that require verification. The goal of the verification process employed by verification environment 124 is to find a way to assert a target node in first target set (T) 134 to a "1" (and to generate a "counter-example trace" illustrating this scenario if a way is found), or to prove that no such assertion of the target in first target set (T) 134 is possible. In a preferred embodiment, the present invention is applied to design (D) netlist 120 in which the only combinational gate type is a multi-input AND; inversions are represented implicitly as edge attributes. Note that (A OR B) appears as NOT((NOT A) AND (NOT B)) in such a representation.

Verification environment 124 creates product form (P) 144, which contains a structural identification of a "product of sums" representation for the target from first target set (T) 134 and then performs any of the variety of possible disjunctive decompositions thereof. A "product of sums" representation is of the form ((A OR B) AND (C OR D OR E)); or more generally, a "conjunction" (AND) of clauses which are "disjunctions" (ORs). Verification environment 124 identifes a product-of-sums representation of a target in first target set (T) 134 with N conjuncted clauses, where each clause is a disjunction of multiple literals. There are a large variety of decompositions appropriate to such a representation. One such set of possible decompositions arises from the decision to split upon only one clause, rendering one sub-target per literal of the split clause conjuncted with each of the retained clauses.

Continuing with the above example, verification environment 124 may split either the clause (A OR B), or the clause (C OR D OR E). If splitting the clause (A OR B), verification environment 124 obtains two sub-targets: (A AND (C OR D OR E)), and (B AND (C OR D OR E)). If splitting the clause (C OR D OR E), verification environment 124 obtains three sub-targets: ((A OR B) AND C), and ((A OR B) AND D), and ((A OR B) AND E). Another set of decompositions arises from the decision to split two of the clauses, and so on, up to splitting all N clauses. With the example above, if verification environment 124 splits both clauses, verification environment 124 obtains the six sub-targets: (A AND C), and (A AND D), and (A AND E), and (B AND C), and (B AND D), and (B AND E). Yet another set of decompositions arises from the decision to only partially split one of the clauses, e.g. to split (C OR D OR E) into (C OR (D OR E)), resulting in four sub-targets (A AND C), and (A AND (D OR E)), and (B AND C), and (C AND (D OR E)).

Processor 104 executes instructions from programs, often stored in RAM 102, in the course of performing the present invention. In a preferred embodiment of the present invention, processor 104 executes verification environment 124. Verification environment 124 contains a decomposition toolkit 154 for enhancing verification of a hardware design by decomposing the "target" under verification into a set of simpler sub-targets, which may be independently verified. Decomposition toolkit 154 contains a structural decomposition unit 156, a sequential-structural decomposition unit 158, structural decomposition rules 160, semantic BDD-based decomposition unit 162, a sequential-semantic BDD-based decomposition unit 164, semantic decomposition rules 166, an accumulation unit 168 and a recursive unit 170.

Structural decomposition unit 156 executes a purely structural method for decomposing targets. Sequential-structural decomposition unit 158 provides extensions to the structural target decomposition process which allow sequential decompositions. Structural decomposition rules 160 includes a set of commonly useful heuristic automated decisions for deciding how to structurally decompose targets. Semantic BDD-based decomposition unit 162 provides a semantic BDD-based method for decomposing targets. Sequential-semantic BDD-based decomposition unit 164 includes extensions to the BDD-based target decomposition process which allow sequential decompositions. Semantic decomposition rules 166 contains a set of commonly useful heuristic automated decisions for deciding how to decompose BDD-based target representations. Accumulation unit 168 provides a mechanism to accumulate verification results obtained from independent analysis on the individual decomposed sub-targets to apply as results for the original target. Recursive unit 170 includes a mechanism for recursive application of the decomposition algorithms in structural decomposition unit 156, sequential-structural decomposition unit 158, semantic BDD-based decomposition unit 162, and sequential-semantic BDD-based decomposition unit 164, to enable "deeper" decompositions of the targets.

Structural decomposition unit 156 executes a purely structural method for decomposing targets, contained in the obtain_pos(target_edge) algorithm to obtain a product of sums form for each target, returned as a queue of Disjunct_Clause structures, to represent a product of sums form as follows: each Disjunct_Clause represents the disjuncted literals (represented as netlist edges) within a distinct clause of the product of sums form; each entry of the queue is conjuncted together.

A pseudocode representative of a preferred embodiment of an implementation of the algorithm used within structural decomposition unit 156 is given below:

```
struct Edge {
  bool is_inverted;
  gate source_gate;
}
// The short-hand new_edge = NOT(edge) represents a function called to return an edge
//"new_edge" whose source_gate is equal to that of "edge", but whose is_inverted attribute is
//opposite in polarity. Similarly new_edge = EDGE(source) is used to create a new_edge whose
// source_gate is "source" and whose is_inverted is "false"
struct Disjunct_Clause {
  Edge CLAUSE_TOP; // used only by structural decomposition rules 160
  queue LITERALS; // edges of the disjunct clause
}
queue obtain_pos(Edge target_edge) {
  pos_queue = {empty queue}
  if( target_edge.is_inverted ) {
    pos = {new Disjunct_Clause};
    pos.CLAUSE_TOP = target_edge;
    pos.LITERALS = {empty queue};
    push(pos_queue, pos);
    queue_disjunct(pos, target_edge.source_gate);
  }
  else {
    queue_conjunct(pos_queue, target_edge.source_gate);
  }
  return pos_queue;
}
queue_disjunct(Disjunct_Clause pos, gate source) {
  // by construction, this will never be called on an "inverted" edge - hence the argument is a
  // source gate (no need to track is_inverted)
  if( source is an AND gate ) {
    for each input edge to source {
      if(edge.is_inverted) {
        push(pos.LITERALS, NOT(edge)); // note - flip the inverted attribute of the
  // edge.source_gate, due to OR representation in AND graph
      }
      else {
        queue_disjunct(pos, edge.source_gate);
      }
    }
  }
  else {
      push(pos.LITERALS, NOT(EDGE(source))); // note - flip the inverted attribute for the
      // source, due to OR representation in AND graph
  }
```

```
}
queue_conjunct(queue pos_queue, gate source) {
// by construction, this will never be called on an "inverted" edge - hence the argument is source
//gate
if( source is an AND gate ) {
    for each input edge to source {
        if(edge.is_inverted) {
            pos = {new Disjunct_Clause};
            pos.CLAUSE_TOP = edge;
            pos.LITERALS = {empty queue};
            push(pos_queue, pos);
            queue_disjunct(pos, edge.source_gate);
        }
        else {
            queue_conjunct(pos_queue, edge.source_gate);
        }
    }
}
else {// push as a singleton disjunct clause
    pos = {new Disjunct_Clause};
    pos.CLAUSE_TOP = EDGE(source);
    pos.LITERALS = {empty queue};
    push(pos.LITERALS, EDGE(source));
    push(pos_queue, pos);
}
}
```

When finished, the queue returned by obtain_pos( ) represents a product of sums form, where each Disjunct_Clause in the queue represents a disjunct clause, and each element of the LITERALS queued therein represents the literals (which are other gates, plus "is_inverted" edge flags) of that disjunct clause. When forming sub-targets from the resulting data, as discussed above, verification environment 124 may choose any of the clauses to split.

Sequential-structural decomposition unit 158 provides extensions to the structural target decomposition process which allow sequential decompositions. If used alone, the structural algorithms contained within structural decomposition unit 156 may fail to identify certain decomposition possibilities because of registers from first register set 136 encountered during the fanin sweep. Decomposition toolkit 154 therefore includes a sequential-structural decomposition unit 158 with extensions to these structural algorithms to enable decompositions through registers from first register set 136, with the intent of maintaining a queue of the initial values of all registers from first register set 136 traversed through in the fanin sweep. As decomposition toolkit 154 traverses through a register from first register set 136, decomposition toolkit 154 pushes the initial value of the register from first register set 136 onto the queue. As decomposition toolkit 154 returns out of the recursion with recursive unit 170, decomposition toolkit 154 pops the initial value of the register from first register set 136. Decomposition toolkit 154 then fabricates a second register set (R') 140 with initial value sequences identical to those of first register set 136 onto the corresponding disjunct literals as the literals are queued up. Additionally, to avoid infinite recursions in case of cyclic sequential logic, decomposition toolkit 154 utilizes a "marked" flag to safely truncate the structural search. Note, however, that the strict use of "marked" as described herein may be relaxed to allow the application to continue vs. truncate the fanin sweep using any variety of other heuristics. Decomposition toolkit 154 additionally maintains an "inversion-passed" boolean, flipped every time decomposition toolkit 154 recursively calls queue-conjunct on an inverted edge, which now happens when traversing through next-state functions.

A pseudocode representative of a preferred embodiment of an implementation of the algorithm used within sequential-structural decomposition unit 156 is given below:

```
queue obtain_pos(Edge target_edge) {
    pos_queue = {empty queue}
    init_value_pipeline = {empty queue}
    if( target_edge.is_inverted ) {
        pos = {new Disjunct_Clause};
        pos.CLAUSE_TOP = target_edge.source_gate;
        pos.LITERALS = {empty queue};
        push(pos_queue, pos);
        queue_disjunct(pos, target_edge.source_gate, init_value_pipeline);
    }
    else {
        queue_conjunct(pos_queue, target_edge, init_value_pipeline, false);
    }
    return pos_queue;
}
queue_disjunct(Disjunct_Clause pos, gate source, queue init_value_pipeline) {
// by construction, this will never be called on an "inverted" edge - hence the argument is source
//gate
```

```
if( source is an AND gate ) {
 if(marked(source)) { // use "marked" to prevent infinite recursions through cyclic logic
    push(pos.LITERALS, add_pipeline(NOT(EDGE(source)), init_value_pipeline)); // note - flip
// the inverted attribute of edge
 }
 else {
   mark(source);
   if( source is an AND gate ) {
    for each input edge to source {
    if(edge.is_inverted) {
       push(pos,add_pipeline(NOT(edge), init_value_pipeline)); // note - flip the inverted attribute
    // of edge
    }
    else {
     queue_disjunct(pos, edge.source_gate, init_value_pipeline);
     }
    }
   }
  else if( source is a register && !next_state_function(source).is_inverted ) {
// next_state_function(source) is the edge correlating to the next state function of source
    // init_value_function(source) is the edge correlating to the initial value function of source
    // a preferred embodiment of the present invention inverts the initial value pushed, since a
// preferred embodiment of the present invention effectively pushes the register down to the
//literal leaves
     push( init_value_pipeline, NOT(init_value_function(source)) );
     queue_disjunct(pos, next_state_function(source).source_gate, init_value_function );
     pop( init_value_pipeline );
}
 else {
     push(pos.LITERALS, add_pipeline(NOT(EDGE(source)), init_value_pipeline)); // note - flip
// the inverted attribute of edge
     }
    }
   }
// this function adds a register pipeline with initial values determined from init_value_pipeline
// onto source_edge,
// a literal to be queued up onto a Disjunct_Clause
Edge add_pipeline(Edge source_edge, queue init_value_pipeline} {
  next_state = source_edge;
  new_gate = source_edge;
new_queue = clone_queue(init_value_pipeline); // so a preferred embodiment of the present
// invention does not wipe out this data structure
  while(new_queue) {
  init_val = pop(new_queue); // get init_vals in reverse-order that they were pushed
  new_gate = Create_Register( );
  init_value_function(new_gate) = init_val;
  next_state_function(new_gate) = next_state;
  next_state = new_gate;
}
return new_gate;
}
queue_conjunct(queue pos_queue, Edge conjunct_edge, queue init_value_pipeline, bool
inversion_passed) {
if(conjunct_edge.is_inverted) {
    inversion_passed = NOT inversion_passed;
}
 source = conjunct_edge.source_gate;
if(marked(source)) { // push as a singleton disjunct clause
  pos = {new Disjunct_Clause}; pos.CLAUSE_TOP = add_pipeline(<inversion_passed,
     source>,
init_value_pipeline);
  pos.LITERALS = {empty queue};
  push(pos.LITERALS, pos.CLAUSE_TOP);
  push(pos_queue, pos);
}
else {
mark(source);
if( source is an AND gate ) {
   if( inversion_passed ) {
    pos = {new Disjunct_Clause};
    pos.CLAUSE_TOP = add_pipeline(<inversion_passed, source>, init_value_pipeline);
    pos.LITERALS = {empty queue};
    push(pos_queue, pos);
    queue_disjunct(pos, source, init_value_pipeline);
   }
  else {
    for each input edge to source {
        queue_conjunct(pos_queue, edge, init_value_pipeline, inversion_passed);
    }
```

```
    }
  }
    else if( source is a register ) {
    push( init_value_pipeline,
inversion_passed?NOT(init_value_function(source)):init_value_function(source) );
//conditionally invert the
//init_value_function since this is the conjunct
      queue_conjunct(pos_queue, next_state_function(source), init_value_pipeline,
inversion_passed);
    pop( init_value_pipeline );
    }
    else {// push as a singleton disjunct clause
    pos = {new Disjunct_Clause};
    pos.CLAUSE_TOP = add_pipeline(<inversion_passed, source>, init_value_pipeline);
    pos.LITERALS = {empty queue};
    push(pos.LITERALS, pos.CLAUSE_TOP);
    push(pos_queue, pos);
    }
  }
}
```

When decomposition toolkit 154 completes the algorithm described above, the queue returned by obtain_pos( ) represents a product of sums form (P') 146, where each Disjunct_Clause in the queue represents a disjunct clause, and each element of the LITERALS queue therein represents the literals (which are other gates, plus "is_inverted" edge flags) of that disjunct clause. When forming sub-targets from the resulting data, as discussed above, decomposition toolkit 154 may choose any of the clauses to split.

Structural decomposition rules 160 contains a set of commonly useful heuristic automated decisions for deciding how to structurally decompose targets. The algorithms employed by sequential-structural decomposition unit 158 and structural decomposition unit 156 render a queue of Disjunct_Clause structures. Each structure represents a disjunct clause which may be split. As discussed above, there are many possible choices of which clauses to split. Particularly, if decomposition toolkit 154 obtains a queue with N disjunct clauses over more than one LITERAL, there are 2^N possible choices of splitting anywhere from 0 to N clauses. The algorithm employed by structural decomposition unit 156 may render some singleton clauses, and splitting those is of no consequence. Additionally, when splitting a clause with M disjuncted literals, there are numerous possible decompositions involving various splitting strategies for the disjuncted literals. For example, given the clause (A OR B OR C), decomposition toolkit 154 may split into three literals A,B,C; or decomposition toolkit 154 may split into two sub-clauses (A, (B OR C)), or (B, (A OR C),) or (C, (A OR B)); or trivially retain (A OR B OR C) intact.

One simple heuristic available to decomposition toolkit 154 in structural decomposition rules 160 is to perform maximal splitting, where decomposition toolkit 154 splits every clause into single literals. Maximal splitting results in the maximum number of sub-targets, each of minimal complexity. Given availability of a large number of machines such as data processing system 100, which may process the sub-targets in parallel, maximal splitting is often a useful choice. However, practically, given expected resource limitations on data processing system 100, maximal splitting may be suboptimal, because many of the sub-targets may contain virtually identical logic and may be of the same complexity. Therefore, solving an unsplit target containing both sub-targets may be of the same complexity as solving each of the split targets. Structural decomposition rules 160 includes several heuristics for deciding when and how to perform useful partial decompositions.

Generally, a larger design under verification correlates to increased resources required for formal analysis of that design; often, exponentially so. Therefore, it is often useful to split clauses which result in the smallest possible sub-target cones. Because sequential designs may generally be cyclic in nature, it may be the case that every literal in a clause (being an arbitrary gate of a design) has the same cone-of-influence as every other. Splitting such clauses tends not to be very useful. Structural decomposition rules 160 includes the useful ability to split clauses so as to maximize the difference in cone-of-influence between any literal in a disjunct clause, and the "top" node of the disjunct clause, stored in the CLAUSE_TOP field of the presentDisjunct_Clause structure. Maximizing the smallest such difference of any literal is ideal (i.e., the smallest difference between any of the literals in a clause and the CLAUSE_TOP of that literal); though maximizing the average, or even the largest such difference, is often useful to render simpler sub-targets. Structural decomposition rules 160 includes rules to maximize all of these measures of difference.

Furthermore, note that the cones of influence of the various clauses generally overlap. It is therefore ideal to maximize not only the difference between a literal's cone size and that of the CLAUSE_TOP of its respective clause, but to maximize the difference between the cone of that literal and its own CLAUSE_TOP which is not included in the CLAUSE_TOP of any other clause. Structural decomposition rules 160 includes rules to maximize the difference between the cone of that literal and its own CLAUSE_TOP which is not included in the CLAUSE_TOP of any other clause.

Finally, note that some literals (and their inverses) may appear in multiple clauses. Splitting clauses with reappearing-literals is -useful, because it may render some trivial sub-targets. For example, consider a representation of the form (A OR B) AND (NOT A OR C) AND X. If decomposition toolkit 154 splits either (A OR B) or (NOT A OR C), decomposition toolkit 154 obtains simplified sub-targets. Assuming a decomposition toolkit 154 splits the former, decomposition toolkit 154 obtains A AND (NOT A OR C) AND X, and B AND (NOT A OR C) AND X. This set simplifies to C AND X, and B AND (NOT A OR C) AND X. Structural decomposition rules 160 includes rules to bias towards such splits to exploit recurring literals, and account for such simplification when using a cone size heuristic as above.

Semantic BDD-based decomposition unit 162 provides a semantic BDD-based method for decomposing targets to build a BDD for the function of the present target from among first target set (T) 134 (where each register from among first register set (R) 136 and RANDOM gate in the combinational fanin of the target correlates to a BDD variable), then to exploit the fact that every "cube" on the BDD represents a disjunct clause. Decomposition toolkit 154 therefore may treat each cube as a disjunct clause for the present splitting. When forming a structural sub-target out of a cube (or arbitrary subset of the BDD (P) 152), semantic BDD-based decomposition unit may use a simple (common) multiplexor-based synthesis of that BDD over the registers from among first register set (R) 136 and RANDOM gates using the algorithm represented in the following pseudocode:

```
gate SYNTHESIZE(BDD node) {
  if(node == BDD_ZERO) {return GATE_ZERO;}
  if(node == BDD_ONE) {return GATE_ONE;}
  invert = BDD_IS_INVERTED(node);
  node = BDD_CLEAR_INVERTED(node);
  gate = Synthesized(node);
  if(!gate) {
    gate = IF_THEN_ELSE(node correlating to BDD_VARID(node),
    // "if" clause
        SYNTHESIZE(BDD_THEN(node)),   // "then" clause
        SYNTH ESIZE(BDD_ELSE(node)));  // "else" clause
    Synthesized(node) = gate;
  }
  if(invert) {return NOT gate;}
  return gate;
}
```

Sequential-semantic BDD-based decomposition unit 164 provides extensions to the BDD-based target decomposition process which allow sequential decompositions. After building BDD (P) 152 for the combinational function of the target from first target set (T) 134, decomposition toolkit 154 may need to replace some of the variables from BDD (P) 152 correlating to registers from first register set (R) 136 with BDDs 132 representing their next-state functions, effectively resulting in a BDD 132 representing a product of sums. Decomposition toolkit 154 sequentially decomposes the next-state functions of registers from first register set (R) 136 whose variables were so replaced. Such replacement may be performed using the common BDD function "compose" from R. Bryant, "Graph-Based Algorithms for Boolean Function Manipulations", IEEE Transactions on Computers 1986, which is incorporated herein by reference in its entirety.

One additional form of bookkeeping by decomposition toolkit 154 is performed. Decomposition toolkit 154 keeps track of which registers from first register set (R) 136 decomposition toolkit 154 so composed in the resulting BDDs 132, so that decomposition toolkit 154 may "add back" the corresponding registers to the literals in first register set (R) 136 when synthesizing the sub-targets similar to function add_pipeline in sequential-structural decomposition unit 156. This bookkeeping is furthermore necessary because the same BDD 132 variable correlating to the same gate from initial design (D) netlist 120 may appear in BDD 132 for different time-frames when performing such a compose.

Rather than creating only one BDD 132 variable for each register and RANDOM gate from first register set (R) 136, in a preferred embodiment of the present invention decomposition toolkit 154 handles this bookkeeping by creating one distinct BDD 132 variable for each register and RANDOM gate per "initial value" sequence that will be needed to synthesize the corresponding sub-targets. Note that sequential-structural decomposition unit 156 queues the initial values of registers from first register set (R) 136 "traversed through" when obtaining product form (P) 144, then appends a pipeline of registers with corresponding initial values onto the literals when re-forming the product form (P) 144. Sequential-semantic BDD-based decomposition unit 164 creates a unique BDD 132 variable for each register and RANDOM gate appearing in the support of the BDD 132, for every distinct sequence of initial values of registers composed "through". Sequential-semantic BDD-based decomposition unit 164 uses hash table 172 to map the BDD 132 variables to the gates of initial design (D) netlist 120 that they represent, along with the corresponding distinct initial value sequences. Hash table 172 is initially empty.

To illustrate this process, assume an example in which decomposition toolkit 154 faces a target from first target set (T) 134 of the form (R1 AND R2), where R1 and R2 are registers from first register set (R) 136 with initial values I1 and I2, respectively. Decomposition toolkit 154 builds the BDD 132 for this function, using BDD 132 variables vR1 and vR2 for R1 and R2 respectively. Decomposition toolkit 154 uses the prefix of "v" to denote the BDD 132 variable associated with a gate. Decomposition toolkit 154 next enter vR1 and vR2 into hash table 172 as:

<BDD variable vR1, (gate R1, initial value sequence EMPTY)>;
<BDD variable vR2, (gate R2, initial value sequence EMPTY)>.

Decomposition toolkit 154 then composes the next-state function of register R1 in place of vR1. This next state function is of the form (R2 OR R3), where R2 is the register already on the BDD for the subsequent time-frame, and R3 is a register with initial value I3.

Before the composition, decomposition toolkit 154 checks hash table 172 to see if a BDD 132 variable for register R2 coupled with initial value sequence (I1) exists, and if a BDD 132 variable for register R3 coupled with initial value sequence (I1) exists. In this example no such BDD 132 variables exist, and decomposition toolkit 154 creates fresh BDD variables for the registers listed above and enters them in hash table 172 as:

<BDD variable vR2a, (gate R2, initial value sequence I1)>;
<BDD variable vR3a, (gate R3, initial value sequence I1)>.

Decomposition toolkit 154 then forms a BDD 132 for this next state function using the new BDD 132 variables vR2a and vR3a, and composes that BDD 132 in place of vR2 in the target BDD 132. Decomposition toolkit 154 is left with a BDD 132 representing (vR2 AND (vR2a OR vR3a)). Decomposition toolkit 154 can decompose this remaining BDD 132 into two cubes: (vR2 AND vR2a), and (vR2 AND vR3a).

The corresponding sub-targets are created as logic gates by looking up the BDD 132 variables with their corresponding gates in hash table 172, and building the corresponding logic functions accordingly. For example, to synthesize (vR2 AND vR2a), decomposition toolkit 154 looks up vR2 to see that it correlates to R2 with no pipeline. Decomposition toolkit 154 looks up vR2a and see that it correlates to R2 with a single-stage pipeline with initial value I1. Therefore, decomposition toolkit 154 creates the corresponding register with next-state function R2 and initial value I1. Decomposition toolkit 154 also builds an AND gate over these two registers. To synthesize (vR2 AND vR3a), decomposition toolkit 154 looks up vR2 and see that it correlates to R2 with no pipeline. Decomposition toolkit 154 looks up vR3a and see that it correlates to R3 with a single-stage pipeline with initial value I1. Decomposition toolkit 154 then creates the corresponding register with next-state function R3 with initial value I1. Decomposition toolkit 154 builds an AND gate over these two registers.

Decomposition toolkit 154 may extend the approach discussed above to compose an arbitrary number of registers from first register set (R) 136, and can even decompose distinct time-frames of the same register from first register set (R) 136. For example, decomposition toolkit 154 could have subsequently composed either vR2 or vR2a (or both) in the above BDD 132 example with (vR2 AND (vR2a OR vR3a)). Note that when decomposition toolkit 154 composes a variable which already has a non-EMPTY initial value sequence, decomposition toolkit 154 will pre-pend the new initial value onto the existing one, in a manner similar to that used by the add_pipeline function of sequential-structural decomposition unit 158 to add registers in reverse of the order in which they are pushed. For example, decomposition toolkit 154 is composing the next-state function of R2 for BDD 132 variable vR2a, vR2a already has an initial value sequence of of I1, and R2 has an initial value sequence of I2. As a result, decomposition toolkit 154 will use the initial value sequence (I2, I1) for hash table 172 accesses.

Note that decomposition toolkit 154 consistently-renames BDD 132 variables to reflect distinct time-frames and initial value sequences over the gates that appear across multiple time-frames, enabling the sound resulting decompositions.

Semantic decomposition rules 166 provide set of commonly useful heuristic automated decisions for decomposing BDD 132-based targets. There are some differences between the heuristic in semantic decomposition rules 166 and those in structural decomposition rules 160. For example, semantic decomposition rules 166 does not use CLAUSE_TOP to resolve problems created by overlapping cones. Decomposition toolkit 154 instead estimates clause size by the cone of influence sizes of the nodes correlating to the BDD 132 variables in a cube when using a cone size-based approach.

Additionally, rather than splitting on cubes alone, decomposition toolkit 154 may use semantic decomposition rules 166 to choose arbitrary subsets of the BDD 132 as sub-targets. Decomposition toolkit 154 may naturally exploit the canonical nature of BDD 132 to choose BDD 132 subsets which encode several cubes (and hence reduce the number of sub-targets), yet whose number of BDD 132 nodes (used to represent those subsets) is small (to heuristically maximize cone sharing). This heuristically reduces the size of the synthesized sub-targets.

Accumulation unit 168 provides a mechanism to accumulate verification results obtained on decomposed targets to apply as results for the original target in first target set (T) 134. There are several types of verification results that verification environment 124 may accumulate. First, there are counterexample traces 174, which illustrate how verification environment 124 may assert a verification target from first target set (T) 134. Note that any trace showing an assertion of a sub-target of an original target from first target set (T) 134 also shows an assertion of the original target from first target set (T) 134, due to the nature of the disjunctive target decomposition used by decomposition toolkit 154. No additional work is necessary to map the trace from the sub-target to one for the original target from first target set (T) 134. Because hitting the sub-target renders unnecessary any additional work to solve the other sub-targets correlating to the original target from first target set (T) 134, verification environment 124 may neglect expending additional resources on those sub-targets.

Additionally, verification environment 124 enables proofs of target unreachability which represent the fact that the corresponding target from first target set (T) 134 may never be asserted. Due to the nature of the disjunctive target decomposition used by decomposition toolkit 154, a preferred embodiment of the present invention will use accumulation unit 168 to record proof that every sub-target is unreachable before verification environment 124 concludes that the corresponding original target from first target set (T) 134 is unreachable.

There are also coverage metrics that accumulation unit 168 will accumulate. Examples include a note that "the target cannot be hit for the first N time-steps from the initial states." Accumulation unit 168 may be configured to use only the minimal such N obtained upon any sub-target as the value propagated for the corresponding original target from first target set (T) 134, because certain sub-targets (and hence the overall original target) have not been validated as being unhittable for larger values, even if certain sub-targets were.

Recursive unit 170 provides a mechanism for recursive application of decomposition algorithms used by decomposition toolkit 154 to enable "deeper" decompositions of the targets from first target set (T) 134. It may be desirable to explore "deeper" decompositions, beyond the first disjunction tree, for greater reductions. Recursive unit 170 provides two solutions to enable this deeper exploration.

First, recursive unit 170 enables operation of the algorithms from structural decomposition unit 156, sequential-structural decomposition unit 158, structural decomposition rules 160, semantic BDD-based decomposition unit 162, sequential-semantic BDD-based decomposition unit 164, semantic decomposition rules 166, and accumulation unit 168 to obtain a "local" decomposition. Then, under the framework of a transformation-based verification toolset in verification environment 124, decomposition toolkit 154 may re-run structural decomposition unit 156, sequential-structural decomposition unit 158, structural decomposition rules 160, semantic BDD-based decomposition unit 162, sequential-semantic BDD-based decomposition unit 164, semantic decomposition rules 166, and accumulation unit 168 on the earlier-generated individual sub-targets, possibly with other transformations (such as retiming or localization) interspersed between the two target decomposition engines to yield iterative reductions.

Second, recursive unit 170 enables deeper decompositions within a single target decomposition process, (e.g. to enable finer-grained decision making under semantic decomposition rules 166 and structural decomposition rules 160). Such decompositions are enabled by recursive unit 170 re-applying the structural decomposition unit 156, sequential-structural decomposition unit 158, semantic BDD-based decomposition unit 162, sequential-semantic BDD-based decomposition unit 164, and accumulation unit 168 on the individual literals returned within the Disjunct_Clauses returned by the decomposition of the original target from within first target set (T) 134, and taking into account the various decomposition possibilities of these literal cones when deciding how to decompose the target. For example, assume that the target from within first target set (T) 134 is determined to be of the form ((A OR B) AND (C OR D)), and it is determined that D is of the form (E AND (F OR G)). Decomposition unit 164 may decompose latter as (E AND F), and (E AND G). The true decomposition possibility of the target is thus over the expression ((A OR B) AND (C OR (E AND F) OR (E AND G)). Due to differences in the cones of F and G, this "deeper" decomposition may enable a greater reduction, and the selection of a more intelligent decomposition via the various heuristics.

Figure 2A:
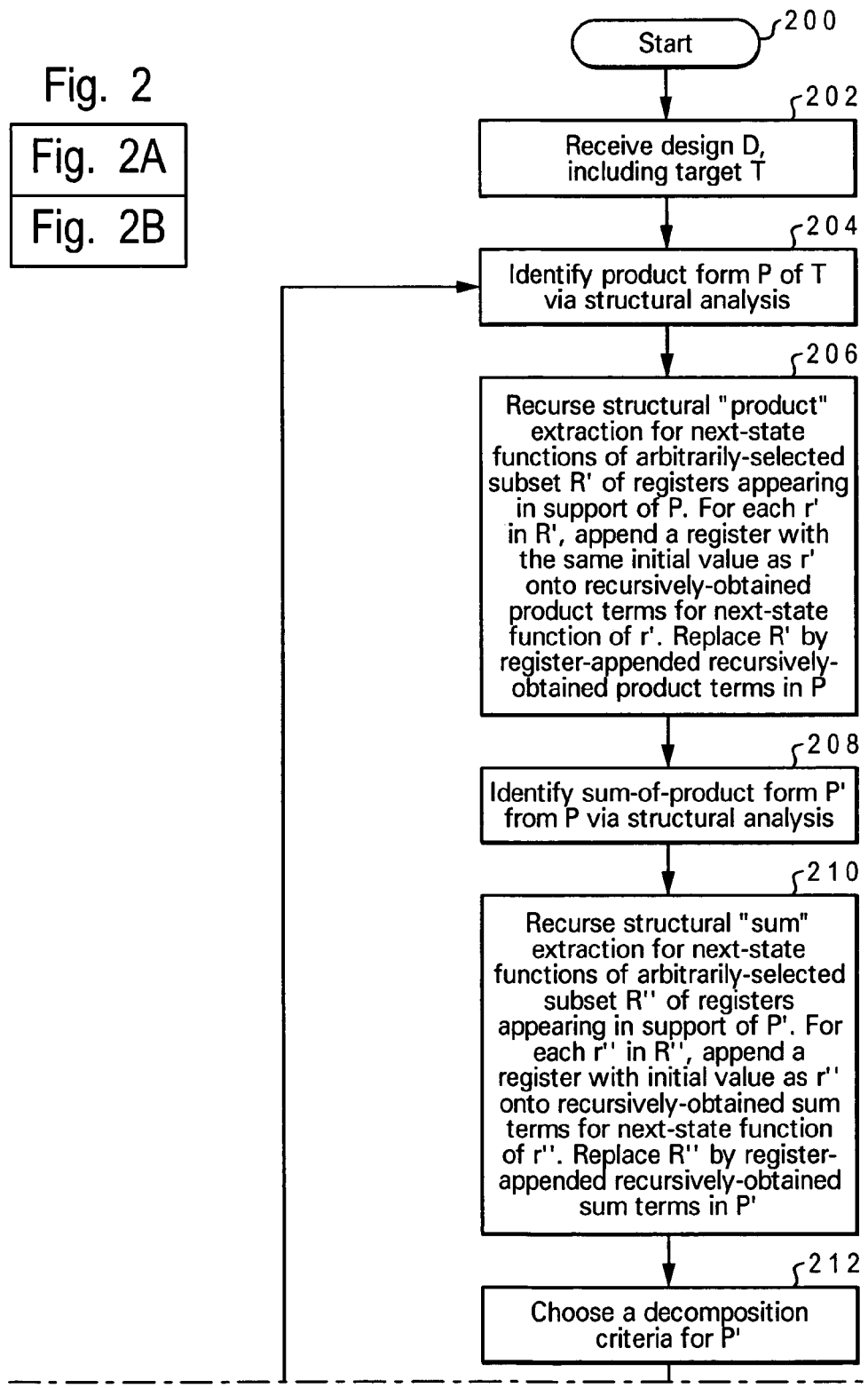
FIG. 2 is a high-level logical flowchart of a process for performing enhanced verification through structural target decomposition.
Figure 2B:
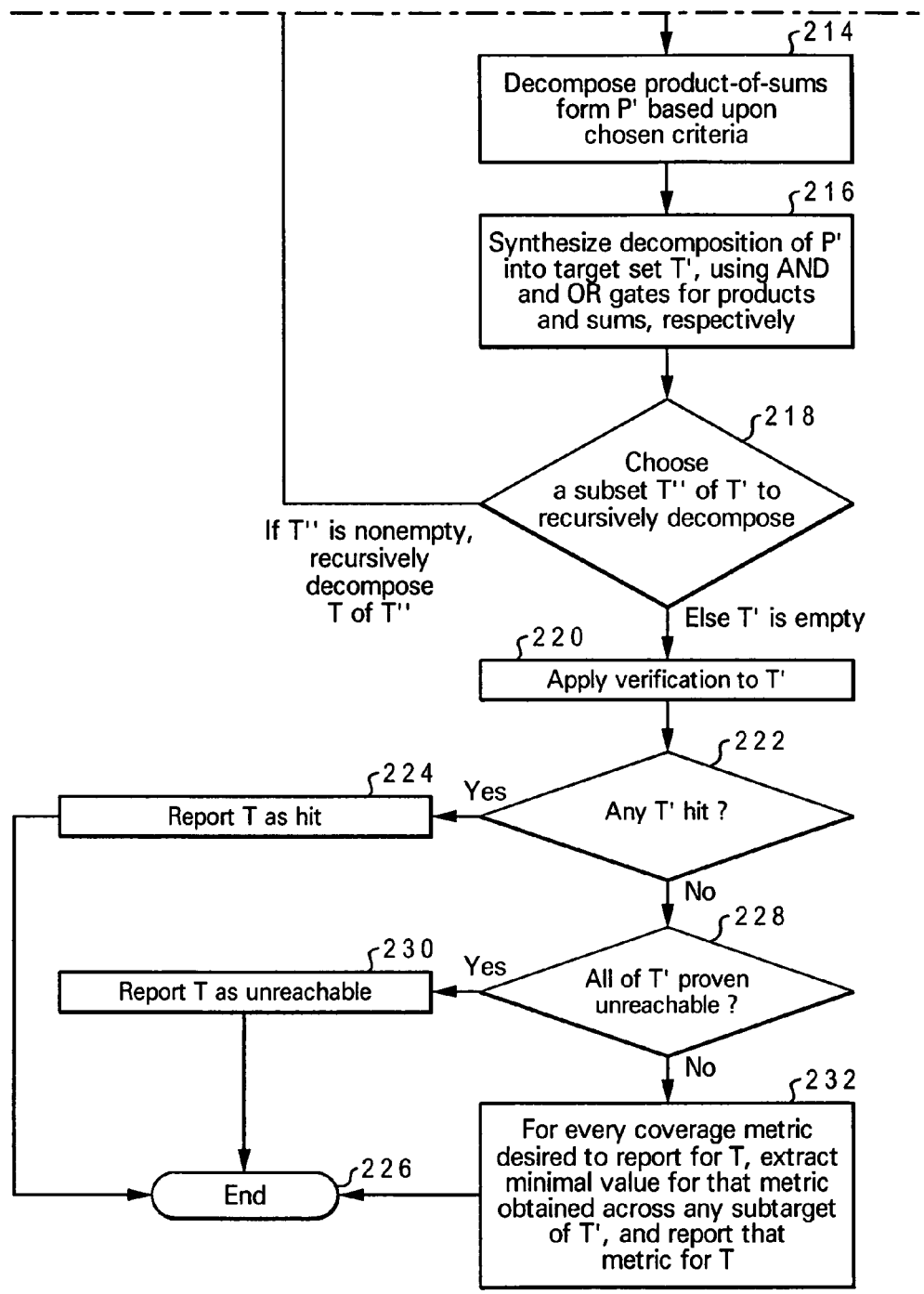

Turning now to FIG. 2, a high level logical flow chart of a process for performing enhanced verification through structural target decomposition is depicted. The process starts at step 200 and then proceeds to step 202, which illustrates verification environment 124 receiving initial design (D) netlist 120 including targets in first target set (T) 134. The process then moves to step 204. At step 204 decomposition toolkit 154 identifies product form (P) 144 of a target from first target set (T) 134 via structural analysis using structural decomposition unit 156.

The process then proceeds to step 206, which depicts verification environment 124 recursing the structural product extraction of product form (P) 144 for next state functions of an arbitrarily selected from second register set (R') 140, which is a subset of registers from first register set (R) 136 appearing in support of product form (P) 144. For each r' in second register set (R') 140, verification environment 124 appends a register with the same initial value as r' onto recursively obtained product terms for the next state function of r'. Verification environment 124 then replaces second register set (R') 140 by register appended recursively obtained product terms in product form (P) 144. The tools for performing step 206 are contained in recursive unit 170. The process then moves to step 208.

At step 208, verification environment 124 identifies the sum of product form (P') 146 from product form (P) 144 via structural analysis using structural decomposition unit 156. The process then proceeds to step 210, which depicts decomposition toolkit using recursive unit 170 to recurse the structural sum extraction contained in sum-of-product form (P') 146 for next state functions for an arbitrarily selected subset of third register set (R") 142 of registers appearing in sum-of-product form (P') 146. For each r" in third register set (R") 142, verification environment 124 appends a register with the same initial value as r" onto recursively obtained sum terms for the next state function of r". Recursive unit 170 then replaces third register set (R") 142 by register appended recursively obtained sum terms in sum-of-product form (P') 146.

The process then proceeds to step 212. At step 212, verification environment 124 chooses a decomposition criteria set for sum-of-product form (P') 146. The process then progresses to step 214, which depicts verification environment 124 decomposing product-of-sums form (P') based upon criteria chosen in step 212. The process next moves to step 216. At step 216, verification environment 124 synthesizes the decomposition from step 214 of sum-of-product form (P') 146 into second target set (T') 148, using AND and OR gates for products and sums, respectively. The process then proceeds to step 218 which depicts verification environment 124 choosing a subset of third target set (T''') 150 of second target set (T') 148 to recursively decompose and determining whether third target set (T''') is empty. If third target set (T''') 150 is non-empty, then verification environment 124 recursively decomposes a first target set of third target set (T''') 150 and the process returns to step 204, which is described above. If third target set (T''') 148 is empty then the process proceeds to step 220.

At step 220, verification environment 124 applies verification to second target set (T') 148. The process then moves to step 222, which depicts verification environment 124 determining whether any targets from second target set (T') 148 have been hit. If targets have been hit then the process moves to step 224 which depicts verification environment 124 reporting a target as hit in output table 122. The process then ends at step 226. Returning to step 222 if no targets are hit then the process next moves to step 228, which depicts verification environment 124 determining whether all of the targets within second target set (T') 148 are proven unreachable. If all of the targets within second target set (T') 148 are proven unreachable, then the process next proceeds to step 230 at which verification environment 124 reports unreachable targets to output table 122. The process then ends at step 226. Returning to step 228, if less than all targets have been proven unreachable, then the process next proceeds to step 232. At step 232, for every coverage metric desired to report for first target set (T) 134, verification environment 124 extracts the minimal value for that metric obtained across any sub-target of second target set (T') 148 and reports that metric for first target set (T) 134.

Figure 3A:
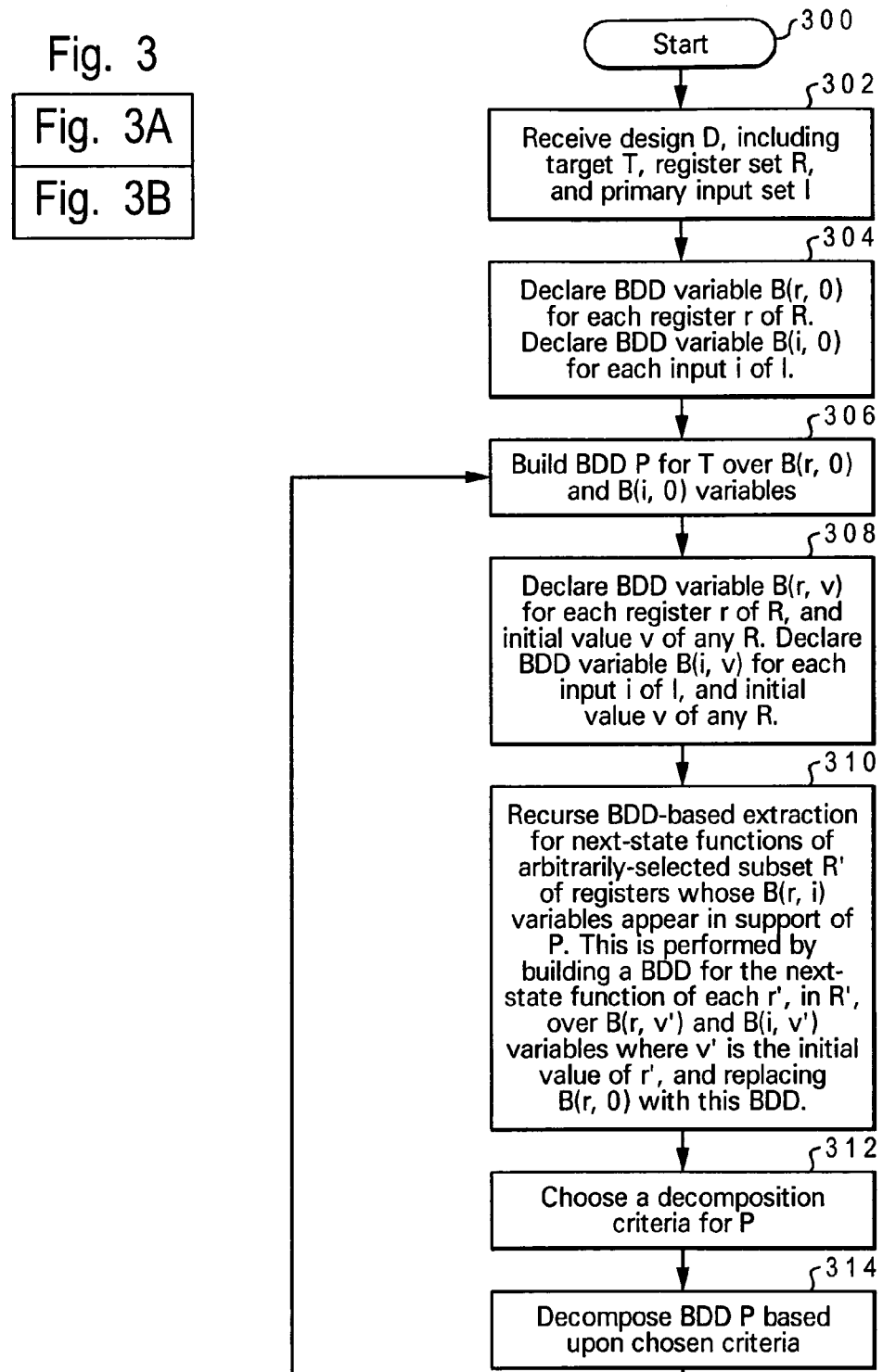
FIG. 3 is a high-level logical flowchart of a process for performing enhanced verification through BDD-based target decomposition.
Figure 3B:
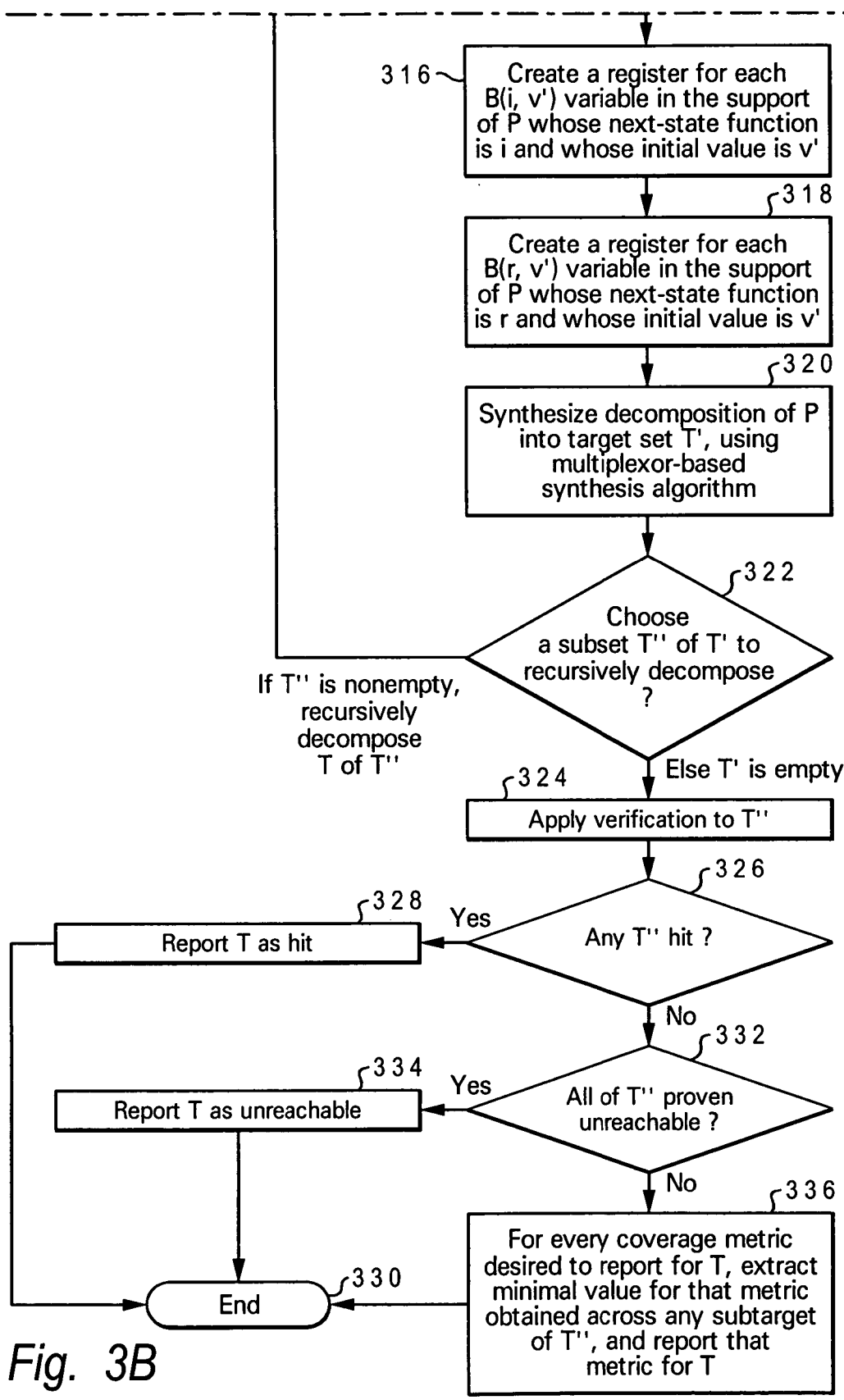

Referring now to FIG. 3, a high level logical flow chart of a process for performing enhanced verification through BDD-based target decomposition is depicted. The process starts at step 300 and then proceeds to step 302, which illustrates verification environment 124 receiving initial design (D) netlist 120 including targets in first target set (T) 134, first register set (R) 136, and primary inputs (I) 138. The process then moves to step 304. At step 304 decomposition tool kit 154 declares a BDD 132 variable B(r,0) for each register r of first register set (R) 136 and declares a BDD 132 variable B(i,0) for each input i of primary inputs (I) 138.

The process then proceeds to step 306, which depicts BDD builder 126 building a BDD (P) 152 for first target set (T) 134 over B(i,0) and B(r,0) variables. The process then moves to step 308.

At step 308, decomposition tool kit 154 declares a BDD 132 variable B(r,v) for each register r of first register set (R) 136 and initial value v of any register r of first register set (R) 136. Decomposition tool kit 154 then declares a BDD 132 variable B(i,v) for each input i of primary inputs (I) 138 and initial value v of any register r of first register set (R) 136. The process then proceeds to step 310, which depicts decomposition toolkit 154 using recursive unit 170 to recurse BDD 132-based extraction for next state-functions of an arbitrarily selected second register set (R') 140, which is a subset of registers from first register set (R) 136 whose B(r,j) variables appear in support of BDD (P) 152 by building a BDD 132 for the next-state function of each r' in second register set (R') 140, over B(r,v') and B(i,v') variables where v' is the initial value of r', and replacing B(r,0) with the resulting BDD 132.

The process then proceeds to step 312. At step 312, verification environment 124 chooses a decomposition criteria set for BDD (P) 152. The process then progresses to step 314, which depicts verification environment 124 decomposing BDD (P) 152 based upon criteria chosen in step 312.

The process next moves to step 316. At step 316, verification environment 124 creates a register for each B(i,v') variable in support of BDD (P) 152 whose next-state function is i and whose initial value is v'. The process then proceeds to step 318, which depicts verification environment 124 creating a register for each B(r,v') variable in support of BDD (P) 152 whose next-state function is r and whose initial value is v'. The process then moves to step 320.

At step 320, verification environment 124 synthesizes the decomposition from step 314 of BDD (P) 152 into second target set (T') 148, using a multiplexor-based synthesis algorithm. The process then proceeds to step 322, which depicts verification environment 124 choosing a subset of third target set (T") 150 of second target set (T') 148 to recursively decompose and determining whether third target set (T") is empty. If third target set (T") 150 is non-empty, then verification environment 124 recursively decomposes a first target set of third target set (T") 150 and the process returns to step 306, which is described above. If second target set (T") 148 is empty then the process proceeds to step 324.

At step 324, verification environment 124 applies verification to second target set (T') 148. The process then moves to step 326, which depicts verification environment 124 determining whether any targets from second target set (T') 148 have been hit. If targets have been hit then the process moves to step 328, which depicts verification environment 124 reporting a target as hit in output table 122. The process then ends at step 330. Returning to step 326 if no targets are hit then the process next moves to step 332, which depicts verification environment 124 determining whether all of the targets within second target set (T') 148 are proven unreachable. If all of the targets within second target set (T') 148 are proven unreachable then the process next proceeds to step 334 at which verification environment 124 reports unreachable targets to output table 122. The process then ends at step 330. Returning to step 332, if less than all targets have been proven unreachable, then the process next proceeds to step 336. At step 336, for every coverage metric desired to report for first target set (T) 134, verification environment 124 extracts the minimal value for that metric obtained across any sub-target of second target set (T') 148 and reports that metric for first target set (T) 134.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed on a computer readable medium containing a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method for performing verification of an electronic design, said method comprising:

receiving a design, wherein said design includes a first target set and a first register set comprising one or more registers;

forming a structural product extraction from one or more targets from said first target set;

first recursing said structural product extraction for one or more next-state functions of a subset of said one or more registers;

second recursing a sum-of-products form from said structural product extraction for one or more next-state functions of a subset of said one or more registers;

decomposing a product-of-sums form of a result of said second recursing to generate a decomposition of said product-of-sums form;

synthesizing said decomposition of said product-of-sums form into a second target set;

choosing a subset of said second target set to recursively decompose;

in response to said subset of said second target set being nonempty, recursively decomposing said first target set; and in response to said second target set being empty, applying verification to said second target set.

2. The method of claim 1, further comprising:

ascertaining that all targets of said subset of said second target set are unreachable; and in response to asecertaining that all targets of said subset of said second target set are unreachable, reporting an unreachability result of said first target set.

3. The method of claim 1, further comprising:

ascertaining that a target from said subset of said second target set has been hit; and in response ascertaining that a target from said subset of said second target set has been hit, reporting a hit of said first target set.

4. The method of claim 1, wherein:

said step of second recursing said sum-of-product form for one or more next-state functions of a subset of said one or more registers further comprises second recursing said sum of product form for one or more next-state functions of an arbitrarily-selected subset of said one or more registers appearing in support of said sum-of-product form by, for one of one or more selected registers in said one or more registers appearing in a third register set, appending a generated register with an initial value onto one or more recursively-obtained sum terms for a next state function of said one of said one or more selected registers in said one or more registers appearing in a third register set; and said step of first recursing said structural product extraction for one or more next-state functions of a subset of said one or more registers further comprises first recursing said structural product extraction for one or more next-state functions of an arbitrarily-selected subset of said one or more registers appearing in support of said structural product extraction by:

for one of one or more selected registers in said one or more registers appearing in a second register set, appending a calculated register with a generated initial value equal to an initial value of said one of one or more selected registers in said one or more registers appearing in a second register set onto one or more recursively-obtained product terms for a next state function of said one of one or more selected registers in said one or more registers appearing in a second register set to generate one or more register-appended recursively-obtained product terms; and replacing said second register set with said one or more register-appended recursively obtained product terms.

5. The method of claim 1, wherein:

said step of synthesizing said decomposition of said product-of-sums form into a second target set, further comprises said decomposition of said product-of-sums form into a second target set, using AND and OR gates for products and sums, respectively;

said step of identifying a sum-of-product form from said structural product extraction further comprises identifying a sum-of-product form from said structural product extraction using structural analysis; and said step of identifying a product form of one or more targets from said first target set to form a structural product extraction further comprises identifying a product form of one or more targets from said first target set using structural analysis to form a structural product extraction.

6. The method of claim 1, further comprising:

ascertaining that no targets of said subset of said second target set are hit, and that at least one unhit target of said subset of said second target set was not demonstrated to be unreachable; and in response to ascertaining that no targets of said subset of said second target set are hit, and that at least one unhit target of said subset of said second target set was not demonstrated to be unreachable, for one or more coverage metrics desired for said first target set, extracting a minimal value for one of said coverage metric across one or more subtargets of said subset of said second target set and reporting said minimal value for one of said coverage metric desired for said first target set.

7. The method of claim 1, wherein said step of decomposing said product-of-sums form to generate said decomposition of said product-of-sums form further comprises:

choosing one or more decomposition criteria for said sum-of-product form; and decomposing said product-of-sums form based upon said one or more decomposition criteria to generate a decomposition of said product-of-sums form.

* * * * *